United States Patent
Roberts et al.

(10) Patent No.: US 7,227,095 B2
(45) Date of Patent: Jun. 5, 2007

(54) WIRE BONDERS AND METHODS OF WIRE-BONDING

(75) Inventors: Stuart L. Roberts, Boise, ID (US);
Rich Fogal, McCall, ID (US)

(73) Assignee: Micron Technology, Inc., Boise, ID (US)

( * ) Notice: Subject to any disclaimer, the term of this patent is extended or adjusted under 35 U.S.C. 154(b) by 273 days.

(21) Appl. No.: 10/635,947

(22) Filed: Aug. 6, 2003

(65) Prior Publication Data

US 2005/0029329 A1   Feb. 10, 2005

(51) Int. Cl.
B23K 9/013   (2006.01)
B23H 1/00    (2006.01)
B23K 1/00    (2006.01)

(52) U.S. Cl. .................... 219/69.11; 219/56.22; 219/68; 219/69.17; 228/4.5

(58) Field of Classification Search ............ 219/68, 219/69.11, 69.17, 56.1, 56.22, 56.21; 228/110.1, 228/4.5; 140/139, 140
See application file for complete search history.

(56) References Cited

U.S. PATENT DOCUMENTS

| | | | |
|---|---|---|---|
| 3,553,417 A * | 1/1971 | Smith et al. ............. 219/56.1 |
| 4,528,435 A * | 7/1985 | Billon-Pierron et al. . 219/69.17 |
| 4,594,493 A * | 6/1986 | Harrah et al. ........... 219/56.22 |
| 5,062,565 A | 11/1991 | Wood et al. |
| 5,095,187 A * | 3/1992 | Gliga ......................... 219/68 |
| 5,176,310 A * | 1/1993 | Akiyama et al. ........ 228/180.5 |
| 5,263,631 A * | 11/1993 | Felber ....................... 228/4.5 |
| 5,322,207 A | 6/1994 | Fogal et al. |
| 5,601,740 A * | 2/1997 | Eldridge et al. ......... 219/130.4 |
| 5,773,780 A * | 6/1998 | Eldridge et al. ......... 219/56.22 |
| 5,891,796 A * | 4/1999 | Nakamura et al. .......... 438/617 |
| 5,986,209 A | 11/1999 | Tandy |
| 6,025,728 A | 2/2000 | Hembree et al. |
| 6,130,474 A | 10/2000 | Corisis |
| 6,165,887 A | 12/2000 | Ball |
| 6,247,629 B1 | 6/2001 | Jacobson et al. |
| 6,258,624 B1 | 7/2001 | Corisis |
| 6,259,153 B1 | 7/2001 | Corisis |
| 6,261,865 B1 | 7/2001 | Akram |
| 6,336,269 B1 * | 1/2002 | Eldridge et al. ............. 29/885 |
| 6,784,394 B2 * | 8/2004 | Nishiura .................. 219/56.22 |

FOREIGN PATENT DOCUMENTS

| | | | |
|---|---|---|---|
| JP | 54-158081 A | * | 12/1979 |
| JP | 59-150435 A | * | 8/1984 |
| JP | 61-14817 A | * | 1/1986 |
| JP | 10-135220 A | * | 5/1998 |
| JP | 2000-323517 A | * | 11/2000 |

* cited by examiner

Primary Examiner—Geoffrey S. Evans
(74) Attorney, Agent, or Firm—Perkins Coie LLP

(57) ABSTRACT

Wire bonders and methods of wire-bonding are disclosed herein. In one embodiment, a method includes attaching a wire to a terminal of a microelectronic component and generating an arc between a first electrode and a second electrode to sever the wire at a point at least proximate to the first and second electrodes. In another embodiment, a wire bonder includes a bond head having a capillary, a first electrode and a second electrode each disposed relative to the bond head, and a controller operably coupled to the first and second electrodes. The controller has a computer-readable medium containing instructions to perform the above-mentioned method.

37 Claims, 6 Drawing Sheets

WIRE BONDERS AND METHODS OF WIRE-BONDING

TECHNICAL FIELD

The present invention relates to wire bonders and methods for wire-bonding microelectronic components. In particular, aspects of the invention relate to wire bonders having a plurality of electrodes and methods for wire-bonding microelectronic components utilizing the plurality of electrodes to sever the wire.

BACKGROUND

Microelectronic devices are used in cell phones, pagers, personal digital assistants, computers, and many other products. A packaged microelectronic device can include a microelectronic die, an interposer substrate or lead frame attached to the die, and a molded casing around the die. One process for packaging microelectronic devices at the die level includes (a) attaching individual dies to an interposer substrate, (b) wire-bonding contacts on the dies to corresponding components on the interposer substrate, and (c) encapsulating the dies with a molding compound.

FIG. 1 is a top cutaway isometric view of an existing microelectronic device 10. The microelectronic device 10 includes a substrate 6 and a microelectronic die 4 attached to the substrate 6. The microelectronic device 10 shown in FIG. 1 illustrates the substrate 6 and the die 4 before encapsulating the die 4 with an encapsulation compound. The substrate 6 includes a first array of ball-pads 2, a second array of terminal pads 3 proximate to a slot 18, and a trace 22 or other type of conductive line between each ball-pad 2 and corresponding terminal pad 3. The slot 18 extends lengthwise along a medial portion of the substrate 6. The substrate 6 is an interposing device that provides an array of ball-pads for coupling very small contacts on the microelectronic die to another type of device.

The microelectronic die 4 can include a plurality of small contacts 5 and an integrated circuit 7 (shown schematically) coupled to the contacts 5. The contacts are arranged in an array on the microelectronic die 4 so that the contacts 5 are aligned with or otherwise accessible through the slot 18 in the substrate 6. A plurality of wire-bonds 9 electrically couple the contacts 5 of the die 4 to corresponding terminal pads 3 on the substrate 6. A wire bonder forms the wire-bonds 9 between the die 4 and the substrate 6 with a capillary, which feeds wire through a central aperture. For example, a molten ball formed at a protruding end of the wire and the capillary are pressed against one of the contacts 5 to attach the end of the wire to the die 4. The capillary then moves upward and laterally to attach the wire to the terminal pad 3 on the substrate 6.

In other applications, the capillary may attach only one end of the wire-bond. For example, a microelectronic device can include a die and a wire-bond having a first end attached to the die and a second, free end projecting away from the die. In these applications, the wire bonder attaches the end of the wire to the die and then severs the wire. The wire is typically severed by placing an electrical potential on the wire and an opposite potential on a single electrode adjacent to the wire to generate a spark between the electrode and the wire. The single electrode is positioned at a desired point to sever the wire so that the spark cuts the wire and forms a ball at the end of the wire. As set forth in U.S. Pat. No. 5,773,780, the wire bonders can also include a light source that directs light toward a segment of the wire to stabilize the spark.

These approaches, however, have several drawbacks. For example, the point at which the wire is severed is not consistent and predictable because the spark can occur between the electrode and anywhere along a segment of the wire proximate to the electrode. Thus, the length of the wire-bond may be shorter or longer than desired. Moreover, it is difficult and expensive to retrofit existing wiring bonding machines with the light source. Accordingly, there exists a need to improve the process of severing the wire during wire-bonding.

BRIEF DESCRIPTION OF THE DRAWINGS

FIG. 2 is a schematic side cross-sectional view of a wire bonder for attaching a wire to a microelectronic component.

FIG. 3 is a schematic side cross-sectional view of the wire bonder after the capillary has attached the first end of the wire to the microelectronic component.

FIG. 4 is a schematic side cross-sectional view of the microelectronic component and the wire bonder after moving the capillary toward the bond head.

FIG. 5 is a schematic side cross-sectional view of the microelectronic component and the wire bonder after severing the wire.

FIG. 6 is a schematic side cross-sectional view of the microelectronic component, the wire segment, and a second microelectronic component.

DETAILED DESCRIPTION

A. Overview

Figure 1:
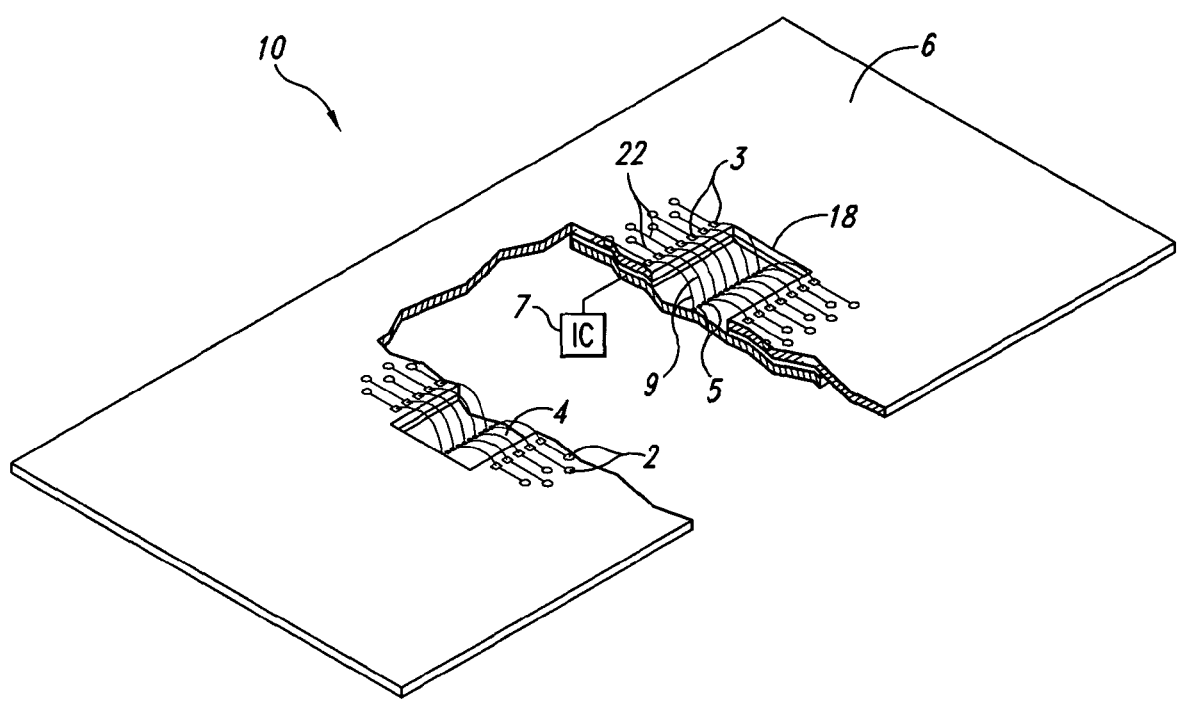
FIG. 1 is a top cutaway isometric view of an existing microelectronic device.

The following disclosure describes several embodiments of wire bonders having a plurality of electrodes and methods of wire-bonding microelectronic components utilizing the plurality of electrodes. Many specific details of the present invention are described below with reference to microelectronic components. The term "microelectronic component," however, is used throughout to include microelectronic devices, micromechanical devices, data storage elements, read/write components, and other articles of manufacture. For example, microelectronic components include SIMM, DRAM, Flash-Memory, ASICS, processors, flip chips, ball grid array (BGA) chips, and other types of microelectronic devices or components. The term "terminal" is used throughout to include bond-pads, ball-pads, contacts, leads, and other electrical connection points. Many specific details of several embodiments of the invention are described below with reference to microelectronic devices including microelectronic dies in order to provide a thorough understanding of such embodiments. A person of ordinary skill in the art will understand, however, that the invention may have other embodiments with additional elements or without several of the features shown and described below with reference to the embodiments of FIGS. 2–8.

One aspect of the invention is directed to methods of wire-bonding. In one embodiment, a method includes attaching a wire to a terminal of a microelectronic component and generating an arc between a first electrode spaced apart from the wire and a second electrode spaced apart from the wire to sever the wire at a point at least proximate to the first and second electrodes. The arc between the first and second electrodes can form a first segment of wire having a first end attached to the terminal and a second, free end. In one aspect of this embodiment, the method further includes positioning the first and second electrodes proximate to the wire before generating the arc. The first and second electrodes can be movable relative to a bond head, or the electrodes can be movable as a unit with the bond head. In another aspect of this embodiment, the first and second electrodes include tips that are positioned on opposite sides of the wire before generating the arc. The first and second electrodes can also include end portions that are oriented at an angle generally normal to the wire.

In another embodiment, a method includes positioning a wire in an opening of a wire severing tool. The wire severing tool includes a first electrode and a second electrode spaced apart from each other and the wire to define the opening. The method further includes generating an electrical discharge between the first and second electrodes of the wire severing tool to sever the wire. The wire severing tool can also include a dielectric member separating the first and second electrodes.

Another aspect of the invention is directed to wire bonders for bonding a wire to a terminal of a microelectronic component. In one embodiment, a wire bonder includes a bond head having a capillary, first and second electrodes each disposed relative to the bond head, and a controller operably coupled to the first and second electrodes. The controller has a computer-readable medium containing instructions to perform at least one of the above-mentioned methods.

B. Method of Wire-Bonding Microelectronic Components

Figure 2:
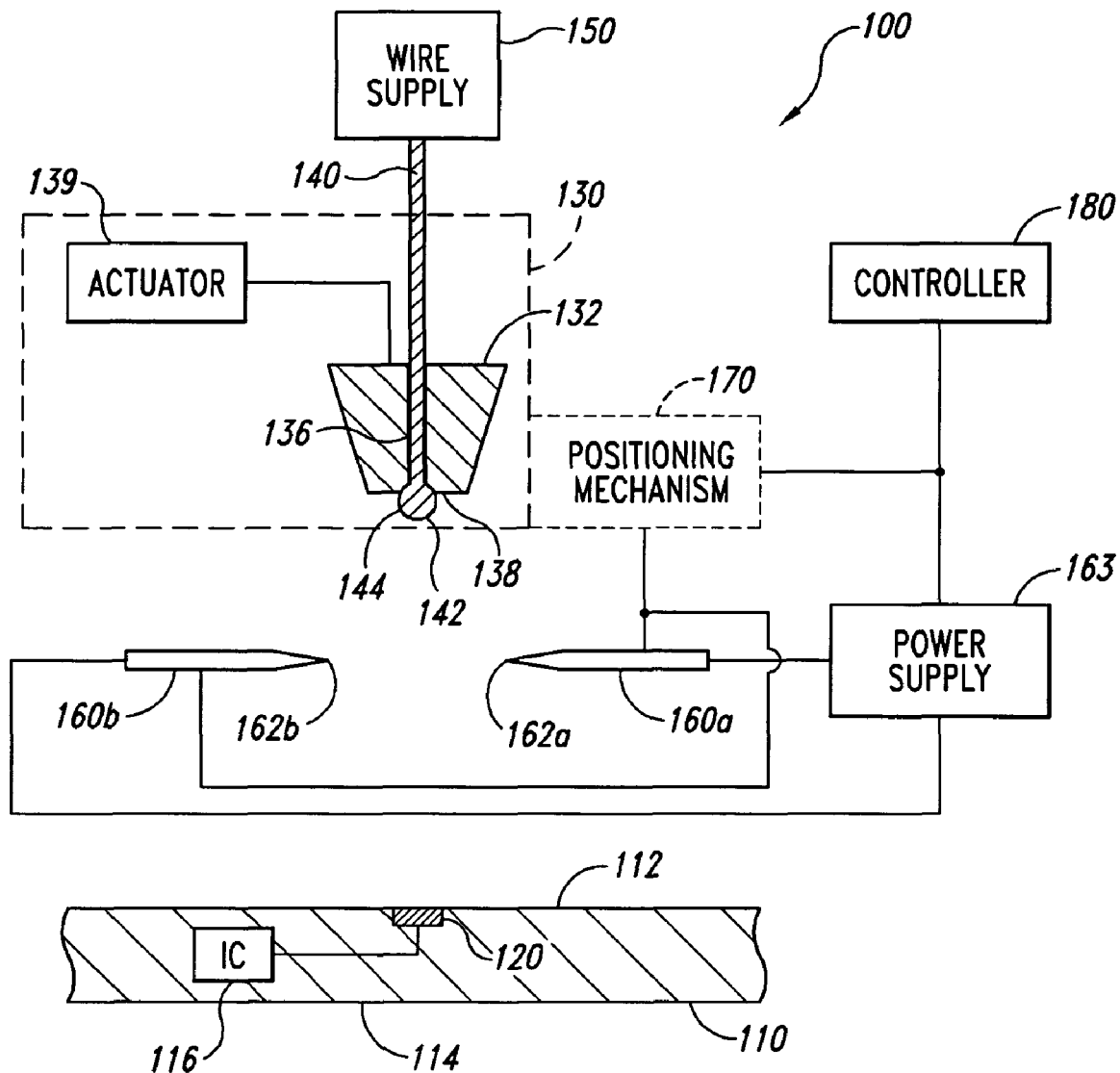
FIGS. 2–6 illustrate various stages in a method of wire-bonding microelectronic components in accordance with one embodiment of the invention.

FIGS. 2–6 illustrate various stages in a method of wire-bonding microelectronic components in accordance with one embodiment of the invention. FIG. 2, more specifically, is a schematic side cross-sectional view of a wire bonder 100 for attaching a wire 140 to a microelectronic component 110. The microelectronic component 110 in the illustrated embodiment is a microelectronic die; however, in other embodiments, the microelectronic component can be an interposer substrate, a lead frame, or other type of component. The microelectronic component 110 includes an active side 112, a back side 114 opposite the active side 112, a terminal 120 in the active side 112, and an integrated circuit 116 (shown schematically) electrically coupled to the terminal 120.

The wire bonder 100 of the illustrated embodiment includes a bond head 130 (partially shown in broken lines) and a wire supply 150 (shown schematically) to provide the wire 140 to the bond head 130. The wire supply 150 can include a spool of the wire 140, and the wire 140 can have a first end 142 with a ball 144. The bond head 130 includes a capillary 132 having an aperture 136 to receive the wire 140 and an actuator 139 (shown schematically) coupled to the capillary 132. The actuator 139 selectively moves the capillary 132 downward to bond the first end 142 of the wire 140 to the terminal 120 of the microelectronic component 110, as described in greater detail below with reference to FIG. 5. The capillary 132 includes a tip 138 at which the aperture 136 can have a larger diameter to at least partially receive the ball 144 of the wire 140.

The wire bonder 100 further includes a first electrode 160a coupled to the bond head 130, a second electrode 160b coupled to the bond head 130, a power supply 163, and a controller 180 (shown schematically) operably coupled to power supply 163 to operate the first and second electrodes 160a–b. The controller 180, more specifically, can include a computer-readable medium to instruct the power supply 163 to place electrical potentials on the first and second electrodes 160a–b, which generate an electrical discharge or arc between the electrodes 160 to sever the wire 140. The first electrode 160a can include a first end 162a with a sharp tip, and the second electrode 160b can include a first end 162b with a sharp tip. The first and second electrodes 160a–b are arranged so that the electrical discharge occurs between the first ends 162a–b, and the sharp tips provide precise control of the path of the discharge and thus the point at which the wire 140 is severed. In one embodiment, the first electrode 160a can be an anode, the second electrode can be a cathode, and the wire 140 can be grounded. In other embodiments, the electrodes 160 may be charged differently, and the wire 140 may not be grounded and/or may have a charge.

In the illustrated embodiment, the wire bonder 100 includes a positioning mechanism 170 (shown schematically in broken lines) coupled to the bond head 130 to move the first and second electrodes 160a–b relative to the bond head 130. The positioning mechanism 170 can move the first and second electrodes 160a–b in applications in which the electrodes 160a–b would otherwise interfere with the movement of the capillary 132. Moreover, the positioning mechanism 170 can move the first and second electrodes 160a–b to the proper position proximate to the wire 140 before the electrical discharge occurs. The positioning mechanism 170 can include mechanical and/or electrical components. For example, in one embodiment, the positioning mechanism 170 can include a servo-driven translating mechanism with linear bearings. In other embodiments, the positioning mechanism 170 can have other configurations. In additional embodiments, one or both of the electrodes 160 may not be movable relative to the bond head 130. In such an embodiment, the wire bonder may not include a positioning mechanism.

Figure 3:
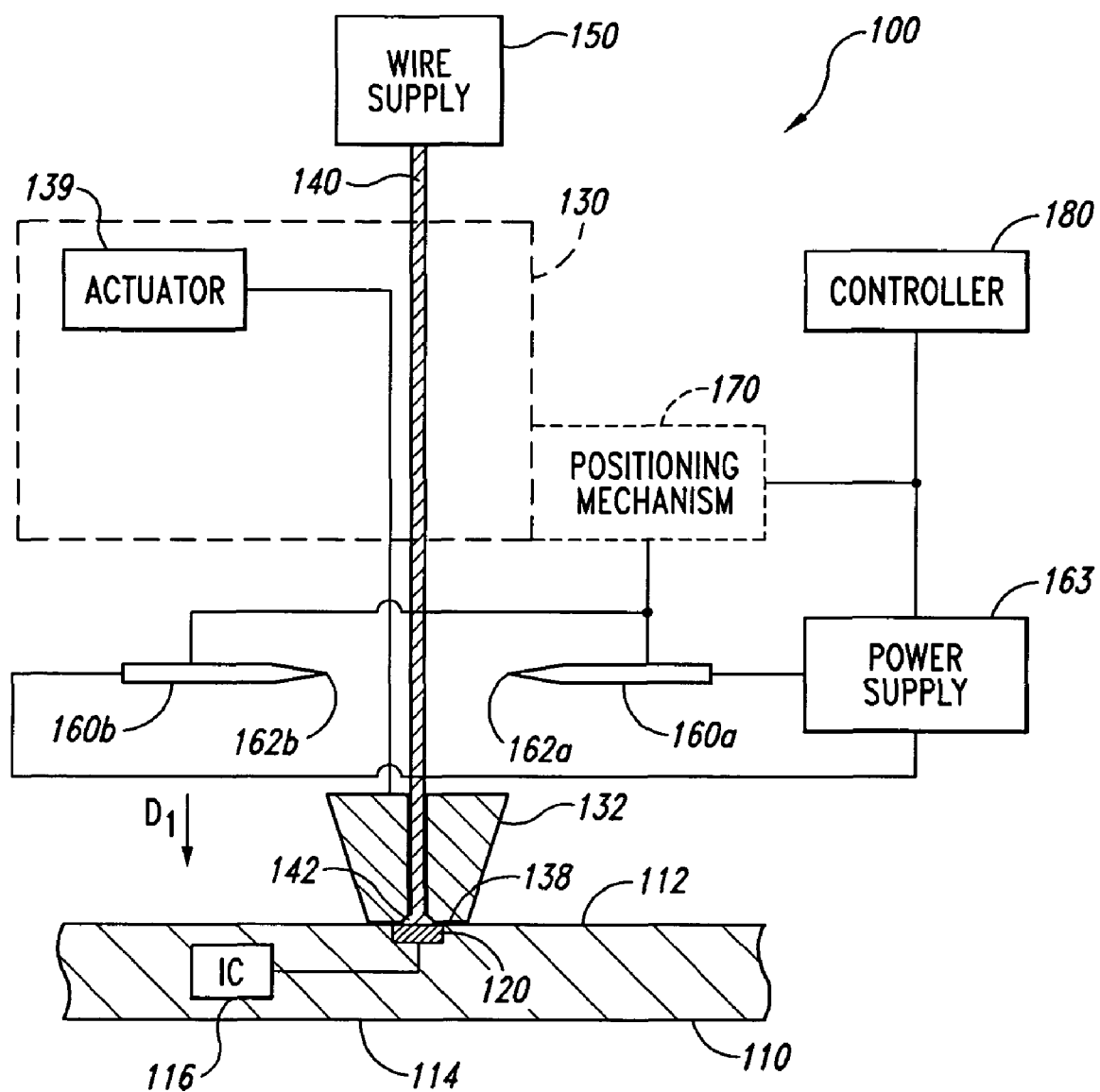

FIG. 3 is a schematic side cross-sectional view of the wire bonder 100 after the capillary 132 has attached the first end 142 of the wire 140 to the microelectronic component 110. Before the capillary 132 moves the first end 142 of the wire 140 toward the microelectronic component 110, a wire tensioner (not shown) can pull the wire 140 back toward the wire supply 150 to position the ball 144 (FIG. 2) at least partially within the aperture 136 (FIG. 2) at the tip 138 of the capillary 132. If the ball 144 is not positioned at least partially within the aperture 136, the capillary 132 may not attach the first end 142 of the wire 140 at the center of the terminal 120. Once the microelectronic component 110 is properly aligned with the bond head 130, the actuator 139 moves the capillary 132 in a direction $D_1$ toward the microelectronic component 110 to press the first end 142 of the wire 140 against the component 110. The capillary 132 can apply heat, ultrasonic energy, and/or pressure to the wire 140 to bond the first end 142 to the terminal 120.

Figure 4:
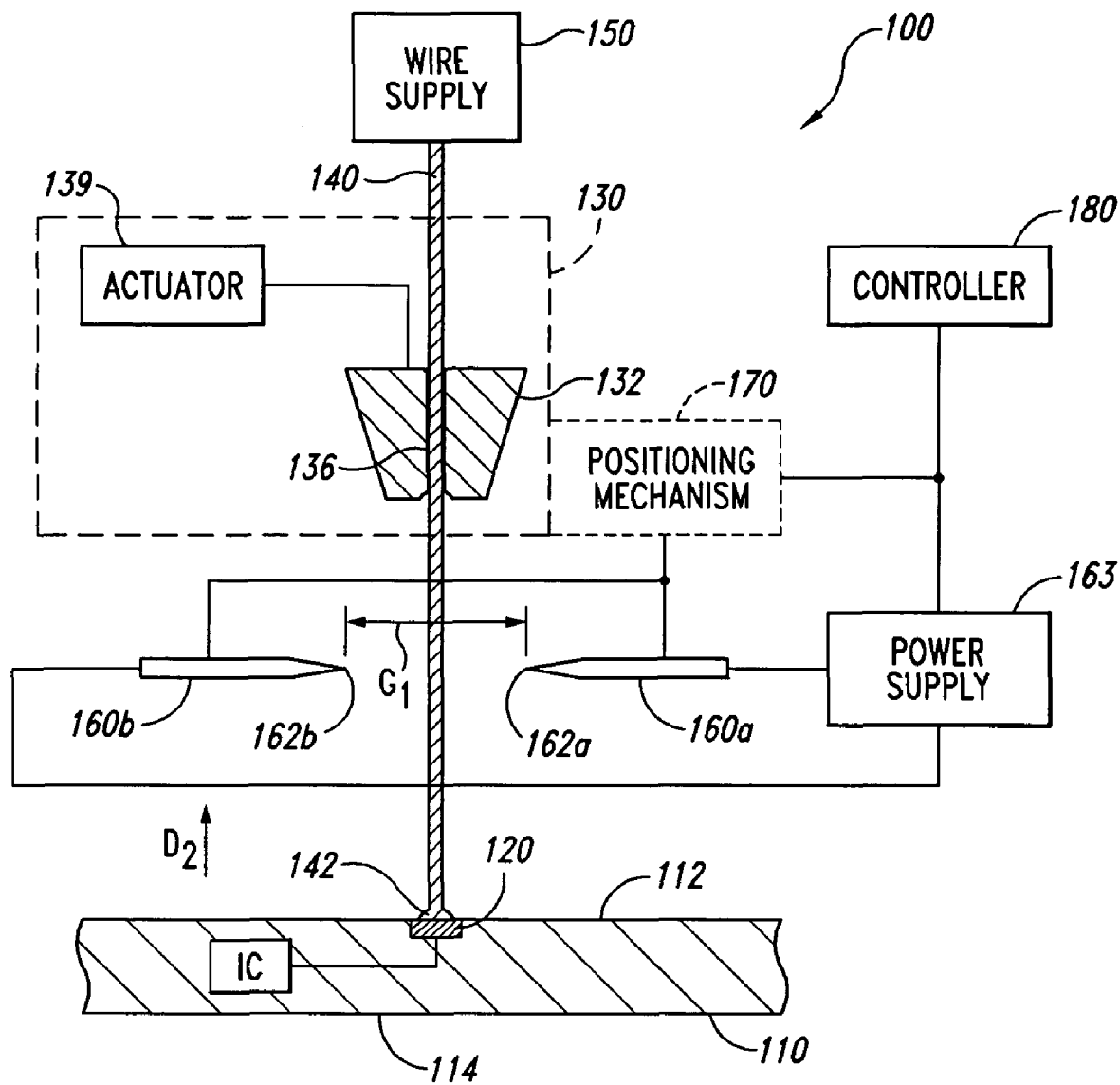

FIG. 4 is a schematic side cross-sectional view of the wire bonder 100 after the capillary 132 has moved toward the bond head 130. The actuator 139 moves the capillary 132 in a direction $D_2$ after the first end 142 of the wire 140 is bonded to the terminal 120 of the microelectronic component 110. As the capillary 132 moves in the direction $D_2$, the wire 140 feeds through the aperture 136. Next, the positioning mechanism 170 can move the first and second electrodes 160a–b to the discharge position. More specifically, in one embodiment the first ends 162a–b of the first and second electrodes 160a–b are adjacent to opposite sides of the wire 140 and oriented at an angle generally perpendicular to the wire 140. The first ends 162a–b can be spaced apart by a gap G sized to receive the wire 140 and permit arcing between the electrodes 160. The first and second electrodes 160a–b are positioned so that the desired point of severance on the wire 140 is between the first ends 162a–b.

Figure 5:
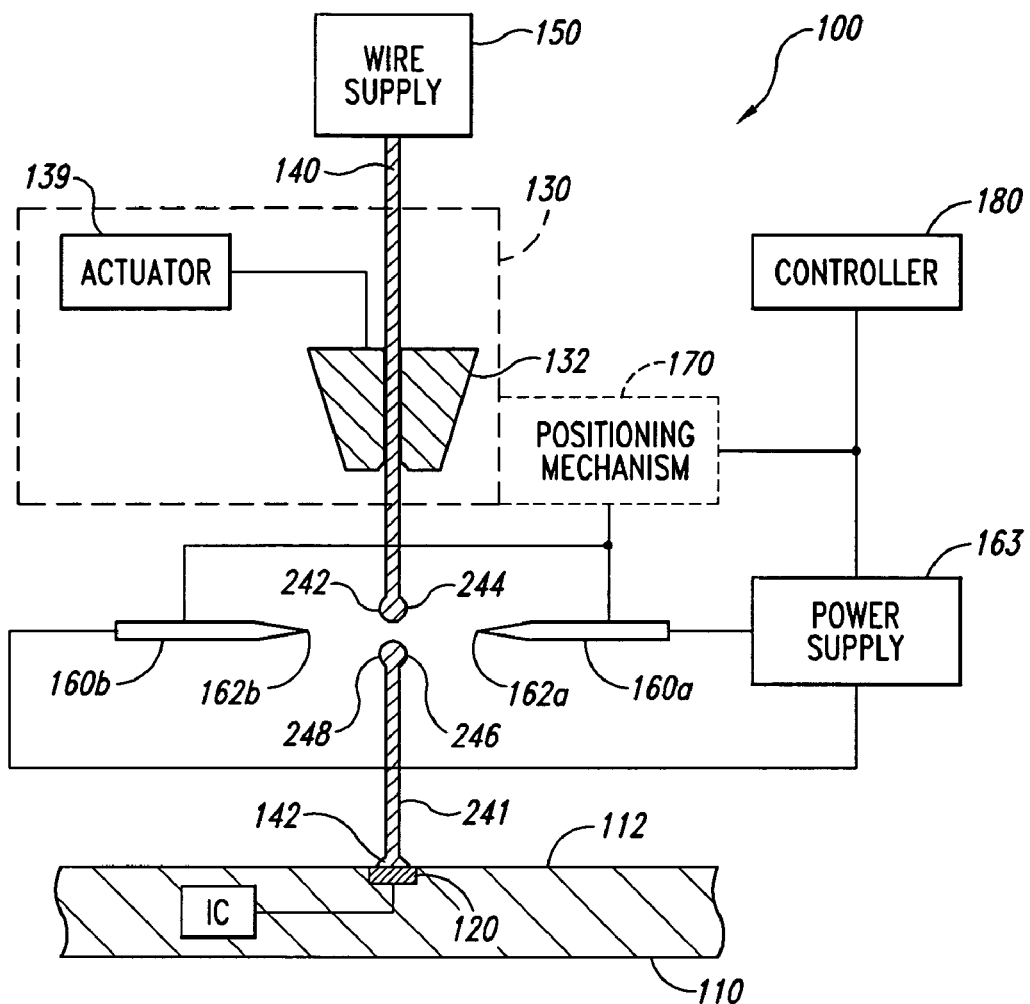

FIG. 5 is a schematic side cross-sectional view of the wire bonder 100 after the wire 140 has been severed. After the first and second electrodes 160a–b are properly positioned on opposite sides of the wire 140, the controller 180 instructs the power supply 163 to energize the first and second electrodes 160a–b. This generates an electrical discharge between the electrodes 160 and across the wire 140, which severs the wire 140 at the desired point between the electrodes 160. The electrical discharge accordingly forms a wire segment 241 having a first end 142 attached to the terminal 120 of the microelectronic component 110 and a second, free end 246 opposite the first end 142. The electrical discharge also forms a new first end 242 on the wire 140. In one embodiment, the electrical discharge can create a ball 248 at the second end 246 of the wire segment 241 and a ball 244 at the first end 242 of the wire 140. In other embodiments, the wire bonder 100 can provide additional electrical discharges to create the balls 244 and 248. After the ball 244 at the first end 242 of the wire 140 is formed, the wire bonder 100 can attach the first end 242 of the wire 140 to another terminal of a microelectronic component.

One feature of the wire bonder in the embodiment illustrated in FIGS. 2–5 is that the wire bonder severs a wire at a predictable and consistent point because the electrical discharge occurs directly between the tips at the ends of the electrodes. One advantage of this feature is that the wire can be severed at a desired point to form a wire segment having a desired length. This is an improvement over wire bonders that use a single electrode because the electrical discharge from a single electrode may not take a direct path to the wire. Another advantage of the wire bonder is its relatively simple configuration. This is an improvement over prior art wire bonders having a single electrode and a light source because the light source must be illuminated at a precise moment and can be difficult to retrofit on existing machines.

Figure 6:
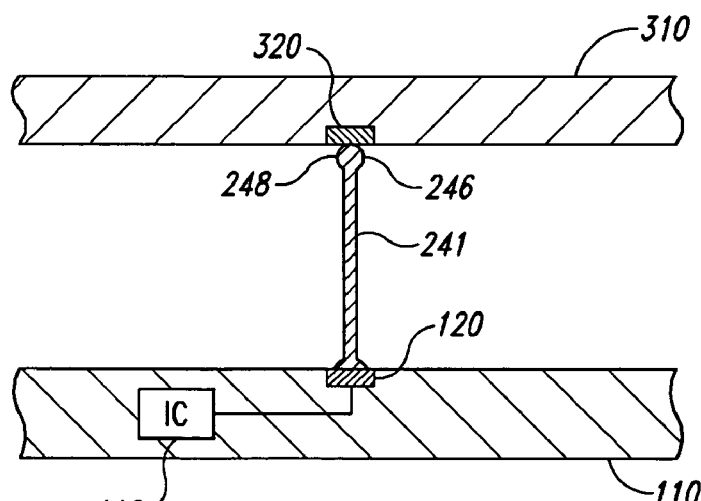

FIG. 6 is a schematic side cross-sectional view of the wire segment 241 attached to a second microelectronic component 310. After the wire 140 (FIG. 5) has been severed to form the wire segment 241, the wire segment 241 can be plated to increase its rigidity. Next, the second end 246 of the wire segment 241 can be attached to a terminal 320 of the second microelectronic component 310 by thermosonic coupling, vibration welding, heat welding, or another suitable process. The ball 248 at the second end 246 can be heated to a temperature sufficient to bond the second end 246 to the terminal 320. The second microelectronic component 310 can be a die with an integrated circuit electrically coupled to the terminal 320 or an interposer substrate with a plurality of leads or ball grid arrays. The wire segment 241 can accordingly couple the integrated circuit 116 on the microelectronic component 110 to an integrated circuit, lead, and/or ball in a ball grid array on the second microelectronic component 310.

C. Other Methods of Wire-Bonding Microelectronic Components

Figure 7:
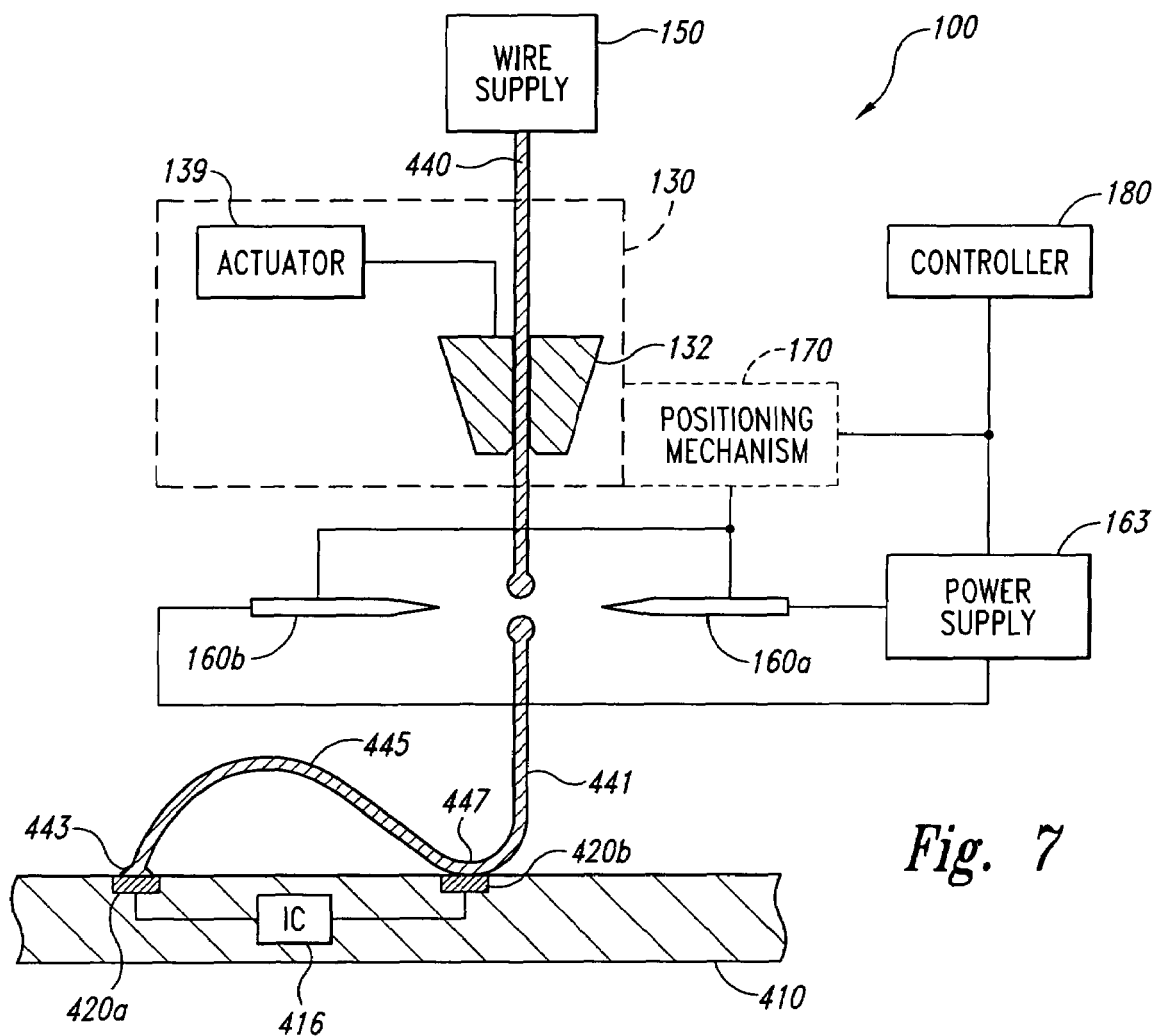
FIG. 7 is a schematic side cross-sectional view of the wire bonder and a wire segment attached to a microelectronic component in accordance with another embodiment of the invention.

FIG. 7 is a schematic side cross-sectional view of the wire bonder 100 and a wire segment 441 attached to a microelectronic component 410 in accordance with another embodiment of the invention. The microelectronic component 410 includes the first terminal 420a, a second terminal 420b, and an integrated circuit 416 (shown schematically) electrically coupled to the first and second terminals 420a–b. Before a wire 440 is severed and the wire segment 441 is formed, the wire bonder 100 attaches a first end 443 of the wire 440 to the first terminal 420a of the microelectronic component 410. Next, the capillary 132 moves laterally to form a loop 445 in the wire 440 and attaches a portion 447 of the wire 440 to the second terminal 420b of the microelectronic component 410. The capillary 132 then feeds out the wire 440 as it moves away from the microelectronic component 410. Next, the electrodes 160a–b are properly positioned and sever the wire, as described above with reference to FIG. 5, to form the wire segment 441. In other embodiments, the wire bonder 100 can form wire segments with other configurations.

D. Other Configurations of Electrodes

Figure 8:
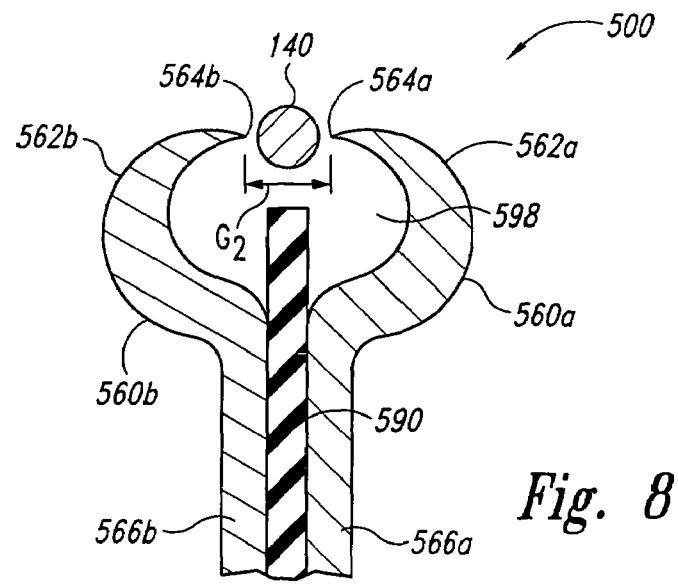
FIG. 8 is a schematic top cross-sectional view of a portion of a wire severing tool in accordance with another embodiment of the invention.

FIG. 8 is a schematic top cross-sectional view of a portion of a wire severing tool 500 in accordance with one embodiment of the invention. The wire severing tool 500 can be used with a wire bonder, similar to the wire bonder 100 described above with reference to FIG. 7, to sever the wire 140 at a desired point. The wire severing tool 500 includes a first electrode 560a, a second electrode 560b, and a dielectric member 590 between the first and second electrodes 560a–b. The first electrode 560a includes an attachment portion 566a for attachment to the wire bonder and a distal portion 562a having a tip 564a. Similarly, the second electrode 560b includes an attachment portion 566b and a distal portion 562b having a tip 564b. The attachment portions 566a–b of the severing tool 500 can be operably coupled to a positioning mechanism to move the tool 500 relative to the bond head of the wire bonder. Alternatively, the severing tool 500 may not be movable relative to the bond head.

The distal portions 562a–b of the first and second electrodes 560a–b define an opening 598 in the severing tool 500 to receive the wire 140. The distal portions 562a–b can have an arcuate configuration as shown in FIG. 8. In other embodiments, the distal portions 562a–b can have angled sections to align the tips 562a–b across a discharge gap. The tips 564a–b are spaced apart by a distance $G_2$ sized to receive the wire 140 with a small space between the wire 140 and the tips 564a–b. To sever the wire 140, the electrodes 560a–b are energized to generate an electrical discharge between the tips 564a–b. The dielectric member 590 is configured to electrically insulate the first and second electrodes 560a–b so that the electrical discharge occurs between the tips 564a–b. In other embodiments, the wire severing tool can have other configurations.

From the foregoing, it will be appreciated that specific embodiments of the invention have been described herein for purposes of illustration, but that various modifications may be made without deviating from the spirit and scope of the invention. Accordingly, the invention is not limited except as by the appended claims.

We claim:

1. A method of wire-bonding, comprising:
positioning a first electrode and a second electrode at least proximate to a wire attached to a terminal of a microelectronic component;
severing the wire with an electrical discharge between the first and second electrodes; and
grounding the wire before severing the wire.

2. The method of claim 1 wherein severing the wire with the electrical discharge comprises forming a first segment of wire having a first end attached to the terminal and a second, free end with a ball.

3. The method of claim 1, further comprising attaching the wire to the terminal by moving a capillary of a bond head to a position at least proximate to the terminal, and wherein positioning the first and second electrodes comprises moving the first and second electrodes relative to the bond head.

4. The method of claim 1 wherein:
the first and second electrodes form at least part of a wire severing tool; and
positioning the first and second electrodes comprises positioning the wire in an opening of the wire severing tool between the first and second electrodes.

5. The method of claim 1 wherein:
the first electrode comprises a first tip and the second electrode comprises a second tip; and
positioning the first and second electrodes comprises positioning the first and second tips on opposite sides of the wire.

6. The method of claim 1 wherein:
the first electrode comprises a first end portion and the second electrode comprises a second end portion; and
positioning the first and second electrodes comprises positioning the first and second end portions at an angle generally normal to the wire.

7. The method of claim 1 wherein:
the first electrode comprises an anode and the second electrode comprises a cathode; and
positioning the first and second electrodes comprises positioning the anode and the cathode at least proximate to the wire.

8. A method of wire-bonding, comprising:
positioning a first electrode and a second electrode at least proximate to a wire attached to a terminal of a microelectronic component;
severing the wire with an electrical discharge between the first and second electrodes; and
attaching the wire to the terminal by moving a capillary of a bond head to a position at least proximate to the terminal, wherein positioning the first and second electrodes comprises moving the first and second electrodes and the bond head as a unit.

9. A wire bonder for bonding a wire to a terminal of a microelectronic component, the wire bonder comprising:
a bond head having a capillary; and
a wire severing tool disposed relative to the bond head, the wire severing tool having a first electrode, a second electrode, and a dielectric member separating the first and second electrodes, the first electrode including a first end portion and the second electrode including a second end portion spaced apart from the first end portion to define an opening for receiving the wire;
wherein the wire severing tool and the bond head are movable as a unit.

10. The wire bonder of claim 9 wherein the first end portion includes a first tip and the second end portion includes a second tip spaced apart from the first tip by a gap sized to receive the wire.

11. The wire bonder of claim 9 wherein the first and second end portions have arcuate configurations.

12. A method of wire-bonding, comprising:
attaching a wire to a terminal of a microelectronic component;
generating an arc between a first electrode and a second electrode to sever the wire at a point at least proximate to the first and second electrodes, wherein the first and second electrodes are moveable with respect to the wire; and
moving the first and second electrodes and a bond head as a unit to position the first and second electrodes at least proximate to the wire before generating the arc.

13. The method of claim 12 wherein generating the arc between the first and second electrodes comprises forming a first segment of wire having a first end attached to the terminal and a second, free end with a ball.

14. The method of claim 12 wherein:
the first electrode comprises a first tip and the second electrode comprises a second tip; and
the method further comprises positioning the first and second tips on opposite sides of the wire before generating the arc.

15. The method of claim 12 wherein:
the first electrode comprises a first end portion and the second electrode comprises a second end portion; and
the method further comprises positioning the first and second end portions at an angle generally normal to the wire before generating the arc.

16. The method of claim 12 wherein:
the first electrode comprises an anode and the second electrode comprises a cathode; and
generating the arc comprises generating the arc between the anode and the cathode.

17. The method of claim 12 wherein:
the first and second electrodes form at least part of a wire severing tool; and
the method further comprises positioning the wire in an opening of the wire severing tool between the first and second electrodes before generating the arc.

18. A method of wire-bonding, comprising:
providing a wire severing tool having a first electrode and a second electrode spaced apart from at least a portion of the first electrode to define an opening;
positioning a wire in the opening between the first and second electrodes; and
generating an electrical discharge between the first and second electrodes to sever the wire;
wherein positioning the wire comprises moving the wire severing tool and a bond head as a unit.

19. The method of claim 18, further comprising bonding the wire to a terminal of a microelectronic component with a wire bonder.

20. The method of claim 18 wherein:
the first electrode of the wire severing tool comprises a first tip and the second electrode comprises a second tip; and
positioning the wire comprises moving the wire severing tool to position the first and second tips on opposite sides of the wire.

21. The method of claim 18 wherein:
the first electrode of the wire severing tool comprises a first end portion and the second electrode comprises a second end portion; and
positioning the wire comprises moving the wire severing tool to position the first and second end portions at an angle generally normal to the wire.

22. A wire bonder for bonding a wire to a terminal of a microelectronic component, the wire bonder comprising:
a bond head having a capillary;
a first electrode and a second electrode each coupled to the bond head; and
a controller operably coupled to the first and second electrodes to selectively generate an electrical discharge between the first and second electrodes to sever the wire;
wherein the first and second electrodes are attached to a dielectric member.

23. The wire bonder of claim 22 wherein the first electrode has a first arcuate portion with a first tip and the second electrode has a second arcuate portion with a second tip spaced apart from the first tip by a gap sized to receive the wire.

24. The wire bonder of claim 22 wherein the first and second electrodes and the bond head are movable as a unit.

25. The wire bonder of claim 22, further comprising a positioning mechanism coupled to the first and second electrodes to move the first and second electrodes relative to the bond head.

26. The wire bonder of claim 22 wherein the first electrode comprises an anode and the second electrode comprises a cathode.

27. A wire bonder for bonding a wire to a terminal of an electronic component, the wire bonder comprising:
a bond head having a capillary;
a first electrode and a second electrode disposed relative to the bond head; and
a controller operably coupled to the first and second electrodes, the controller having a computer-readable medium containing instructions to perform a method comprising—
positioning the first electrode and a second electrode at least proximate to the wire attached to the terminal of the electronic component; and
severing the wire with an electrical discharge between the first and second electrodes.

28. The wire bonder of claim 27 wherein the first and second electrodes are attached to a dielectric member.

29. The wire bonder of claim 27 wherein the first and second electrodes are attached to a dielectric member, and wherein the first electrode has a first arcuate portion with a first tip and the second electrode has a second arcuate portion with a second tip spaced apart from the first tip by a gap sized to receive the wire.

30. The wire bonder of claim 27 wherein the first and second electrodes and the bond head are movable as a unit.

31. The wire bonder of claim 27, further comprising a positioning mechanism coupled to the first and second electrodes to move the first and second electrodes relative to the bond head.

32. The wire bonder of claim 27 wherein the first electrode comprises an anode and the second electrode comprises a cathode.

33. A wire bonder for bonding a wire to a terminal of a microelectronic component, the wire bonder comprising:
a bond head having a capillary;
a first electrode and a second electrode disposed relative to the bond head; and
a controller operably coupled to the first and second electrodes, the controller having a computer-readable medium containing instructions to perform a method comprising—
attaching the wire to the terminal of the microelectronic component; and
generating an arc between the first and second electrodes to sever the wire at a point at least proximate to the first and second electrodes.

34. The wire bonder of claim 33 wherein the first and second electrodes are attached to a dielectric member.

35. The wire bonder of claim 33 wherein the first and second electrodes are attached to a dielectric member, and wherein the first electrode has a first arcuate portion with a first tip and the second electrode has a second arcuate portion with a second tip spaced apart from the first tip by a gap sized to receive the wire.

36. The wire bonder of claim 33 wherein the first and second electrodes and the bond head are movable as a unit.

37. The wire bonder of claim 33, further comprising a positioning mechanism coupled to the first and second electrodes to move the first and second electrodes relative to the bond head.

* * * * *